United States Patent [19]

Mandalia

[11] Patent Number: 5,121,354
[45] Date of Patent: Jun. 9, 1992

[54] RANDOM ACCESS MEMORY WITH ACCESS ON BIT BOUNDARIES

[75] Inventor: Baiju D. Mandalia, Boca Raton, Fla.

[73] Assignee: International Business Machines Corp., Armonk, N.Y.

[21] Appl. No.: 491,894

[22] Filed: Mar. 12, 1990

[51] Int. Cl.⁵ .................................................. G11C 7/00
[52] U.S. Cl. ........................... 365/189.02; 365/230.03; 365/230.04; 365/238.5
[58] Field of Search ....................... 365/230.03, 230.04, 365/189.02, 238.5

[56] References Cited

U.S. PATENT DOCUMENTS

| | | | |
|---|---|---|---|
| 4,099,253 | 7/1978 | Dooley, Jr. ........................ | 364/900 |
| 4,103,329 | 7/1978 | Davis et al. ...................... | 364/200 |
| 4,247,920 | 1/1981 | Springer et al. ................. | 365/230.04 |
| 4,520,439 | 5/1985 | Liepa ................................. | 364/200 |
| 4,561,072 | 12/1985 | Arakawa et al. ................ | 365/230.03 |
| 4,663,729 | 5/1987 | Matick et al. ................... | 364/900 |
| 4,773,048 | 9/1988 | Kai ..................................... | 365/230.03 |
| 4,811,297 | 3/1989 | Ogawa ............................. | 365/230.03 |
| 4,833,657 | 5/1989 | Tanaka ............................. | 365/230.04 |
| 4,845,664 | 7/1989 | Aichelmann, Jr. et al. ..... | 364/900 |

OTHER PUBLICATIONS

IBM Technical Disclosure Bulletin vol. 26, No. 12, pp. 6473-6475, Memory Transfer at Arbitrary Byte Boundaries (Tong).
Hill et al., Digital Systems, Hardware Organization and Design 3rd Edition, pp. 51-61.

*Primary Examiner*—Glenn Gossage
*Attorney, Agent, or Firm*—Stephen A. Terrile; John C. Black; Joseph T. Downey

[57] ABSTRACT

A word addressable random access memory includes additional logic permitting accessing on bit boundaries during read/write operations requiring only one memory cycle. During each memory cycle, two "adjacent" word locations are selected for access concurrently in response to the decoding of one address. Logic responsive to bit boundary select signals determine which memory cells of the two "adjacent" word locations are in fact accessed to store or retrieve a word of data. In one preferred embodiment, the boundary select logic controls the data in/out lines of a pair of odd/even arrays. In another preferred embodiment, the boundary select logic includes logic within each cell of a single memory array.

4 Claims, 5 Drawing Sheets

RANDOM ACCESS MEMORY WITH ACCESS ON BIT BOUNDARIES

BACKGROUND OF THE INVENTION

This invention relates to random access memories (RAM) and more particularly to one in which data words may be stored on and retrieved from bit boundaries.

In data processing systems, most RAMs are organized to store data on word boundaries; and typically data is organized in words for ease of handling, even where system and data packing efficiency is compromised.

However, in many instances such as the processing of serial bit streams in data transmission applications, it is desirable to store the serial data in and retrieve data from a RAM on bit boundaries rather than word boundaries while retaining the parallel storage of a data group of word length.

R. C. Tong (IBM Technical Disclosure Bulletin, Volume 26, No. 12, pages 6473-5, published May, 1984) illustrates and describes a memory with bit boundary accessing using a shift register and row select lines. However, his article suggests two memory cycles to store into two successive odd-even words of memory.

U.S. Pat. No. 4,520,439, issued May 28, 1985 to A. E. Liepa, shows means for storing data on bit boundaries in a word oriented RAM; however it requires reading existing data from two adjacent words, merging new data with the existing data (which is not to be modified) in logic external to the memory and storing the merged data back in memory.

U.S. Pat. No. 4,099,253 issued Jul. 4, 1978 to P. G. Dolley, Jr. show a memory constructed of a plurality of semiconductor chips, each capable of storing one bit at each of a plurality ($2^N$) of locations addressed through N address terminals. By chip selection signals, the chips may be accessed alternatively in parallel to read/write multibit words or individually to read/ write a single bit.

The above and other known prior art, do not show a RAM arrangement in which, during one memory cycle, a complete word may be written into/retrieved from one word location or two adjacent word locations on any selected bit boundary, wherein the RAM is of a conventional type in which the word address decode mechanism is implemented within the chip containing the storage bit cells.

It is therefore a primary object of the present invention to provide an improved memory in which a data word may be stored into/retrieved from one word location or two adjacent word locations on any bit boundary during one memory cycle.

SUMMARY OF THE INVENTION

This and other objects are achieved in one preferred embodiment by using at least one pair of identical chips, designated the even array and the odd array. During each memory cycle both arrays are accessed concurrently by address bits A1-An. An additional address bit A0 (the least significant bit) determines whether the corresponding word positions in each array is selected or whether adjacent word positions of the two arrays are selected concurrently. Logic responsive to bit boundary selection signals determines which bits of each selected word are accessed, while other bit positions of the two words are not affected. Multiplexer (MUX) means aligns the data in the proper bit significant order. In another preferred embodiment, an otherwise standard semiconductor memory chip topography is modified to achieve similar results. A preferred form is as follows:

1. Each "word select line" is fabricated to select the word specified by its address and to further select the word specified by a next higher (or lower) address, i.e., an "adjacent" word. Each word is therefore "selected" by two addresses; and each address "selects" two words.

2. Each bit memory cell is modified to include logic responsive to bit boundary selection signals to determine which memory cells of each of the two selected words is accessed. Those cells which are not accessed are not affected during read and write cycles.

3. The bit boundary selection signals are applied to the cell logic by column lines that are added to the chip topography.

The above and other objects and advantages of the present invention will become apparent to those skilled in the art upon reading the following detailed description when taken in conjunction with the accompanying drawings in which:

DESCRIPTION OF THE PREFERRED EMBODIMENTS

Figure 1:
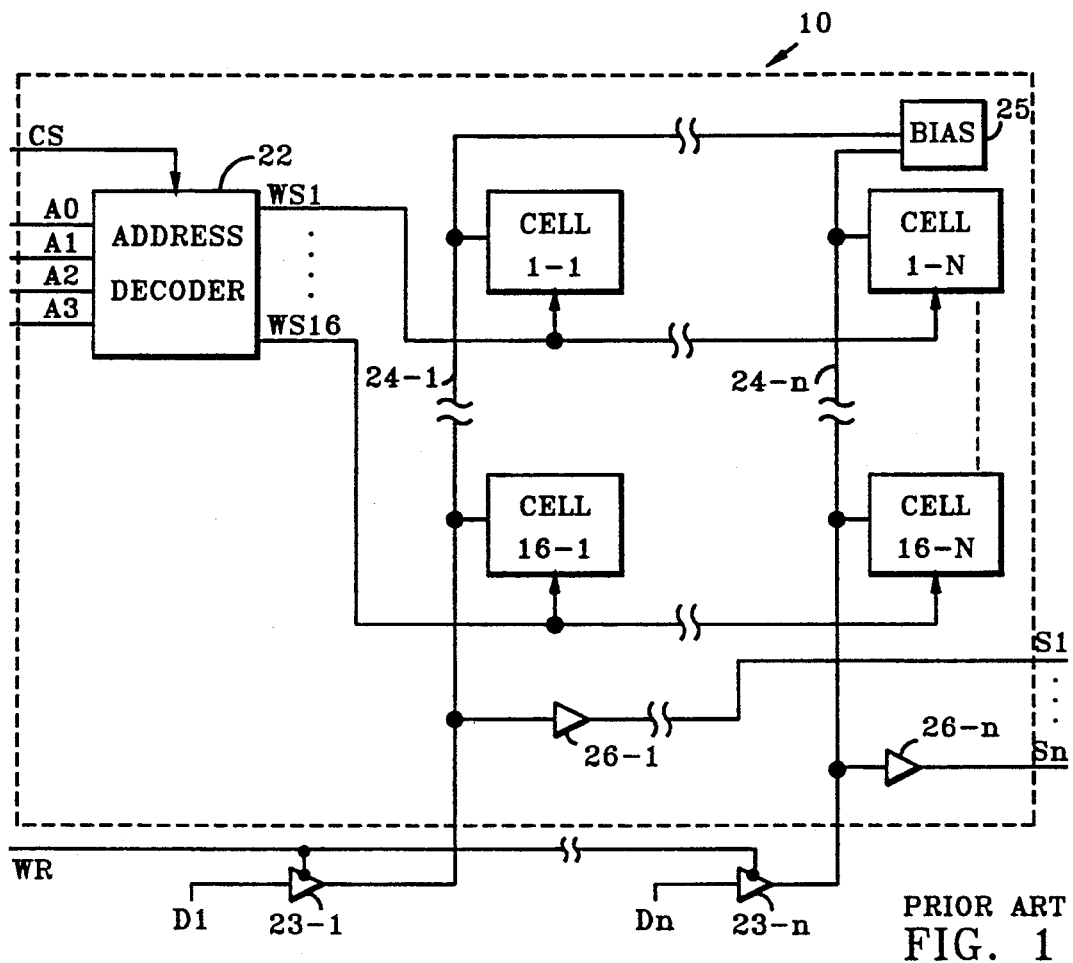
FIG. 1 is a block diagram illustrating a prior art semiconductor memory array.
Figure 2:
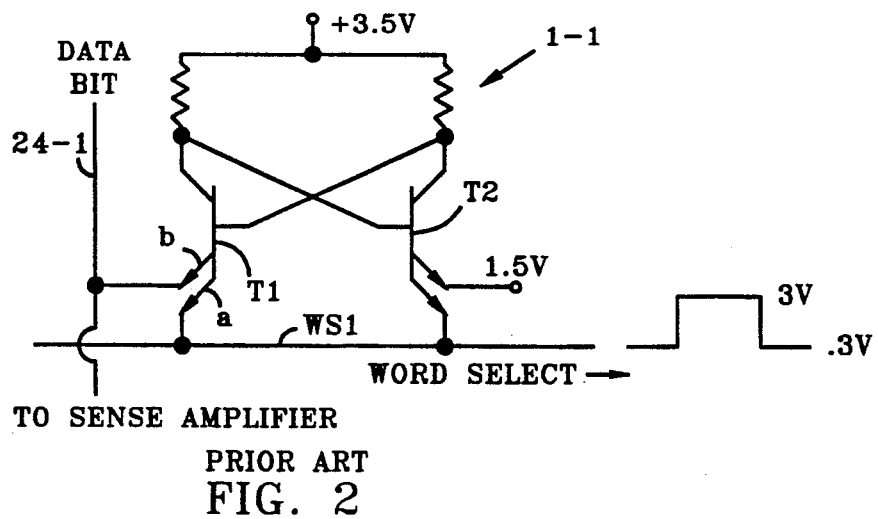
FIG. 2 is a schematic diagram of a prior art memory cell.

FIGS. 1 and 2 illustrate a conventional prior art, semiconductor RAM which is shown and described in greater detail in Digital Systems, Hardware Organization and Design, 3rd Edition by F. J. Hill et al, published by John Wiley and Sons in 1987, pages 51-61. For ease of illustration, the preferred embodiments of the present improvement will be described using this prior art construction as one example of implementation.

Briefly, FIG. 1 shows a RAM package 10 comprised of sixteen (16) n-bit words (cells 1-1 to 1-N . . . 16-1 to 16-N) complete with an address decoder 22 coupled to input address lines A0-A3 and a chip select line CS.

If a write enable signal on line WR=0 (READ operation) and select line CS=1, the addressed n-bit word appears on the output lines S1-Sn. The tri-state buffers 23-1 to 23-n assure that any signal levels on data lines D1-Dn are not applied to the column bit lines 24-1, to 24-n. The bit line bias circuits 25 apply appropriate levels to lines 24-1 to 24-n for reading data from the selected cells via sense amplifiers 26-1 to 26-n without changing the state of the selected cells.

If the write enable signal on line WR=1 (WRITE operation) and select line CS=1, the input data on lines Dl-Dn is written into the addressed location.

Each of the cells 1-1 to 16-N of the RAM 10 is preferably of the type shown in FIG. 2. Two transistors T1 and T2 are crosscoupled and biased for bistable operation. In the cell's normal state, when not selected for read or write operation, the word select line WS1 is at a potential of 0.3 volt and the emitter "b" is held at 0.5 volt. T1 or T2 will be conducting and the other transistor T1 or T2 will be cut off. T1 conducting corresponds to a logic 1 stored in the cell. T2 conducting corresponds to logic 0.

During a read operation, WS1 is raised to 3 volts preventing current flow in emitter "a." If T1 is conducting, its current flows onto the bit line 24-1 from emitter "b" and is detected by the sense amplifier 26-1 (FIG. 1) to produce a corresponding output signal at a logical 1 level. If T1 is turned off, no current flows from emitter "b" to the bit line 24-1 and none is detected by sense amplifier 26-1. Thus the output of the sense amplifier 26-1 will correspond to the logical value stored in the cell 1-1 as long as WS1=3 volts.

During this read operation no external voltage is placed on the bit line 24-1, i.e., WR is at logic 0 and any voltage from line D1 is isolated from line 24-1 by tri-state buffer 23-1 with WR=0.

During a write operation, WR=1, the tri-state buffer 23-1 applies the logic level of D1 to bit line 24-1; then WS1 is raised to 3 volts. If emitter "b" is held at 0 volts by the output of buffer 23-1, T1 will be turned on and T2 turned off (logic 1 state). If emitter "b" is held above 1.5 volts, T1 is turned off and T2 turned on (logic 0 state). The circuit remains in its new state after WS is returned to 0.3 volt.

Making emitter "b" serve as both the input and the output for the cell 1-1 requires circuitry for imposing three separate voltages on the bit line, 0 volts or greater than 1.5 volts from buffer 23-1 and an appropriate intermediate level from the bias network 25.

The first preferred embodiment uses the method of modifying the input data control circuity of an otherwise standard array. In this first preferred embodiment of the present invention, FIG. 3, a pair of arrays 30 and 31 are shown, each of which is preferably of the type 10 as shown in FIGS. 1 and 2. Thus the arrays 30, 31 provide a 32 word RAM with address line A4 (the least significant bit) being added to control accessing of 32 words. Similar components are given the same reference characters.

Thus each array has address inputs A0-A3 and the chip select lines CS are tied together to access both arrays concurrently. In order to address a desired word and its next succeeding word at the same time, the value of A4 is added to the value of A0-A3 by adder circuit 32. If an even address is applied (A4=0), the same values of A0-A3 are applied to both arrays 30, 31 to select corresponding word positions in each array, i.e., consecutively addressed words. If an odd address is applied (A4=1), then the value of A0-A3 applied to the even array is incremented by "1" to access the next higher address word. In all instances, the addressed word and the next higher addressed word are selected concurrently. The sixteen word addresses of array 30 are even and run from 0-30, those of "odd" array 31 from 1-31.

A bit boundary select circuit 33 responds to a bit boundary select code (a group of data bits which define a pre-selected bit boundary within a word location for reading or writing a word of data during a read or write operation) stored in a system register (not shown) to apply logical "1" signals to those lines Bl-Bn corresponding to word bit positions which are to be accessed in array 30 during a read or write operation. These lines are coupled to inputs of AND gates 34-1 to 34-n and AND gates 35-1 to 35-n.

The write signal on line WR forms the other inputs to gates 34-1 to 34-n and the array data inputs Dl-Dn are derived from a write register 37 via a multiplexer circuit 38 and tri-state amplifiers 36-1 to 36-N.

The memory array outputs Sl-Sn (read operation) form second inputs to the AND gates 35-1 to 35-n; and the outputs of the gates are applied to a read register 39 by way of OR circuits 45-1 to 45-N and a multiplexer circuit 40. Multiplexers 38 and 40 reorder the data where appropriate.

The bit boundary lines Bl-Bn are also coupled to AND gates 41-1 to 41-n and 42-1 to 42-n by way of inverters 43-1 to 43-n. The write signal line WR forms the second inputs to the AND gates 41-1 to 41-n and the data input lines Dl-Dn of array 31 are derived from write register 37 via multiplexer 38 and tri-state buffers 44-1 to 44-N.

The memory array outputs Sl-Sn of array 31 form second inputs to the AND gates 42-1 to 42-n. The gate outputs are coupled to the read register 39 via OR circuits 45-1 to 45-n and multiplexer 40.

It can be seen that the inverters 43-1 to 43-n cause the bit positions in array 30 corresponding to a logical 1 signal on the lines Bl-Bn to be accessed and the bit positions in the array 31 corresponding to a logical 0 signal on lines Bl-Bn to be accessed. Thus a full word of storage can be accessed in either array or in portions of both arrays. The MUX's 38 and 40 respond to the same bit boundary code to reorder the data in an appropriate manner.

Figure 3:
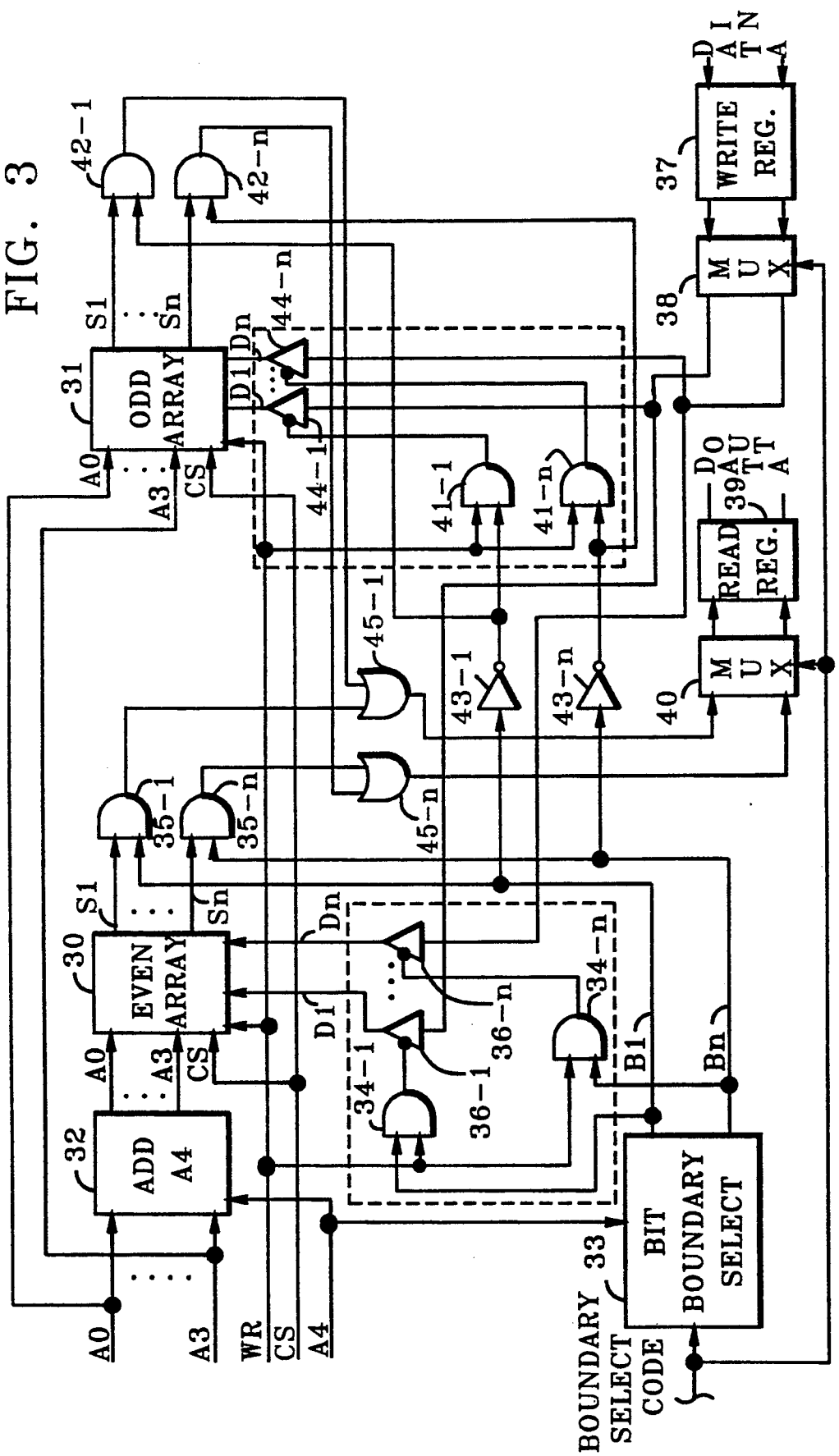
FIG. 3 is a block/schematic diagram of one embodiment of the improved memory utilizing the prior art structures of FIGS. 1 and 2.
Figure 4A:
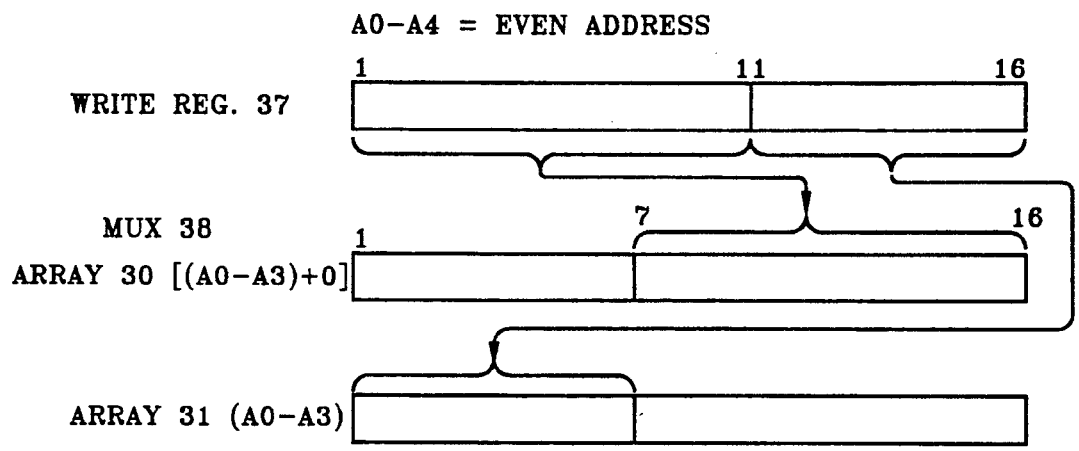
FIGS. 4A and 4B illustrate data reordering performed by the embodiment of FIG. 3.
Figure 4B:
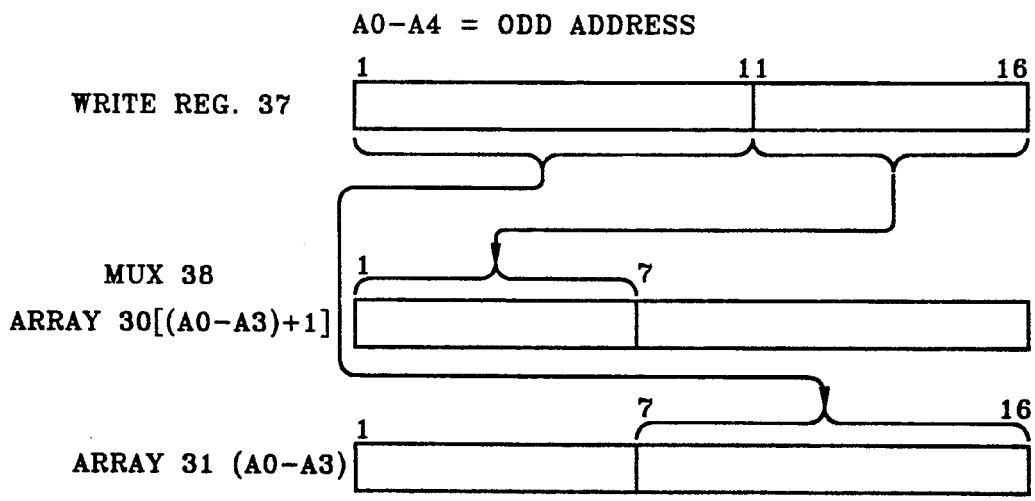

FIGS. 4A and 4B illustrate this briefly for addresses which are "even" and addresses that are "odd" and with arrays 30, 31 storing 16 bit words. In the example of FIG. 4A, the bit boundary code applied to select circuit 33 (FIG. 3) places logical 1 signals on lines B7–B16 and logical 0 signals on lines B1–B6 to access bit cells of locations 7–16 in the array 30 at the address selected by A0–A4 and to access bit cells of locations 1–6 in the array 31 at the address selected by A0–A4. The MUX 38 reorders the data from write register 37 to transfer bits in register 37 positions 1–10 to even array 30 positions 7–16. Data in register 37 positions 11–16 is transferred to odd array 31 positions 1–6.

In FIG. 4B the same operations are performed except that the value of address A0-A3 is incremented by "1" before it is applied to array 30, thereby accessing the next sequential word in array 30 following the word in array 31 at address A0-A3. In addition, the select circuit 33 responds to the odd address value "1" of A4 to invert the signals on lines Bl-Bn of example 4A, i.e., lines B1–B6=1 and lines B7–B16=0.

Attention is directed to the tri-state buffers 23-1 to 23-n of FIG. 2. The tri-state buffers prevent external voltages from being applied to bit lines 24-1 to 24-n during "read cycles".

Similarly, tri-state buffers 36-1 to 36-n and 44-1 to 44-n prevent external voltages on corresponding bit lines during "write" cycles (WR=1) when their corresponding AND gates do not supply a logical 1 input, i.e., their memory cells are not to be accessed. This prevents altering the state of a cell in a "word" which is selected but the "cell" is not selected for access during the "write" cycle. As in FIG. 1, these buffers prevent altering the state of cells during "read" cycles.

Figure 5:
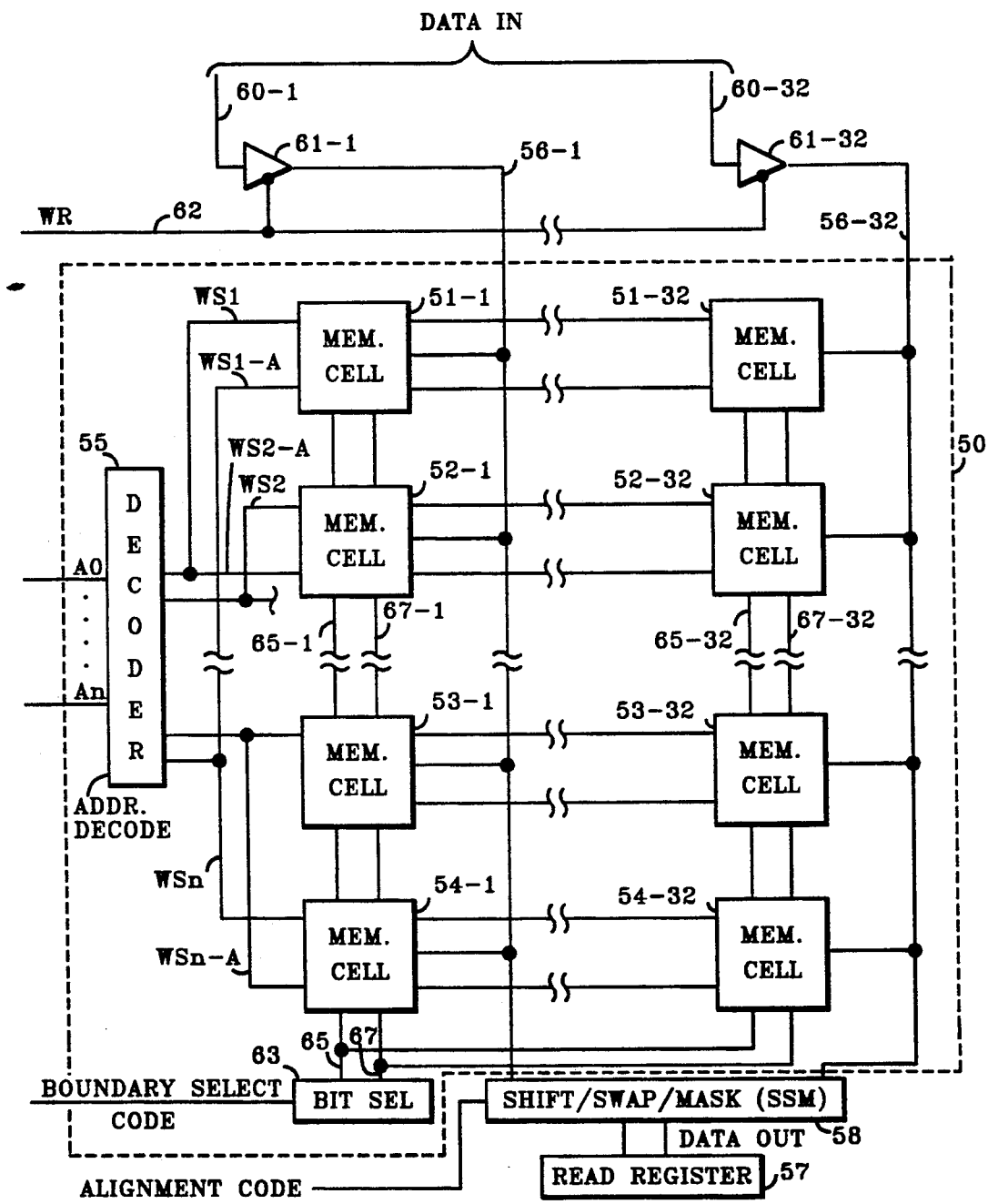
FIG. 5 is a block diagram of a modified memory chip and associated external logic of a second embodiment.

FIG. 5 shows a second preferred embodiment in which the memory cell selection is achieved in a specially fabricated array chip by modification of the memory cell.

Thus, a memory array 50 is preferably similar to array 10 of FIG. 1 (except as modified below) with a plurality of memory cells arranged in rows and columns, each row storing a 32-bit word. Only cells 51-1, 51-32 and 52-1, 52-32 of the first two rows and 53-1, 53-32 and 54-1, 54-32 of the last two rows are shown. An address decoder 55 responds to input address bits on lines A0–An to energize a selected one of the word select lines WS1 to WSn. Data bit lines 56-1 to 56-32 are coupled to a read register 57 via sense amplifiers (not shown) on the chip 50, and shift, swap, mask logic 58. Data in lines 60-1 to 60-32 are coupled to the bit lines 56-1 to 56-32 via tri state buffers 61-1 to 61-32. The write enable line 62 forms second inputs to the buffers 61-1 to 61-32. A multiplexer (not shown) provides data alignment similar to that shown in FIG. 3.

Bit boundary select logic 63 responds to boundary select code to selectively fix row boundary select lines 65-1 to 65-32 of bus 65 at logical "1" or "0." Inverters 66-1 to 66-32 (FIG. 7) fix adjacent row boundary select lines 67-1 to 67-32 of bus 67 at the logical level opposite to that of their corresponding lines 65-1 to 65-32.

Figure 6:
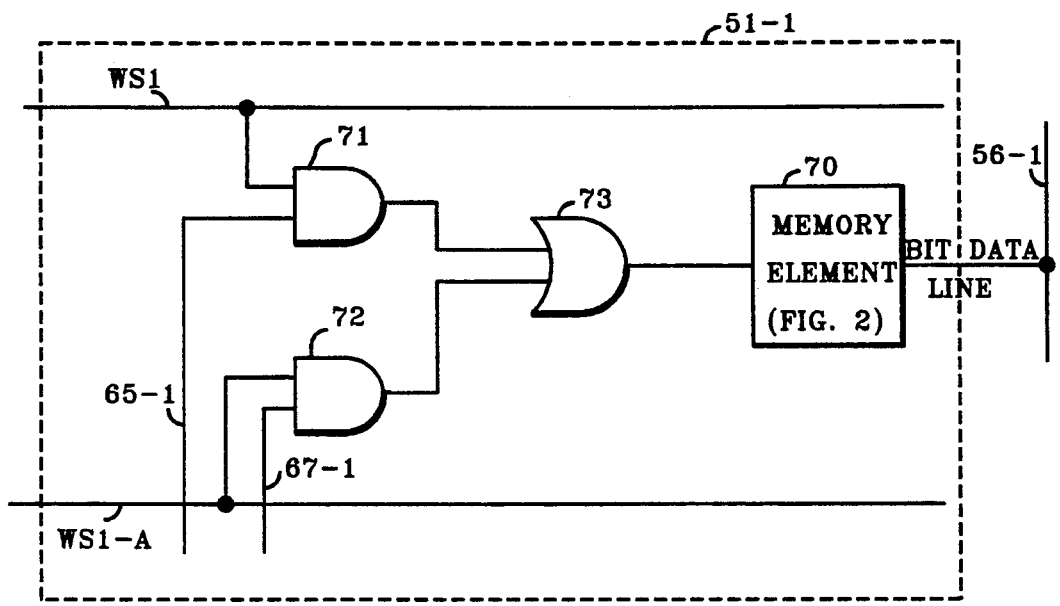
FIG. 6 is a schematic diagram of a modified memory cell of the embodiment of FIG. 5.

Each memory cell such as 51-1, FIG. 6, is modified in the array 50. In addition to the memory element 70, which is preferably the same as cell 1-1 of FIG. 2, cell 51-1 includes boundary select logic including AND gates 71, 72 with outputs coupled to OR gate 73. The output of OR gate 73 is coupled to the line identified as WS1 in FIG. 2. The line WS1 (FIG. 2) of each cell is no longer coupled to a word address select line, rather each is connected to the output of an OR circuit such as 73 of its respective cell select logic.

Referring again to FIG. 5, each word select line WS1–WSn is also coupled to a next adjacent word select line WS2-A to WS1-A respectively. It is thus apparent that each address decoded by circuit 55 selects two words, corresponding to the address and to the next higher address (except line WS1-A which wraps around to the row of WS1 from the previous adjacent row of WSn). Although the preferred embodiment illustrates "adjacent" words could be those of "next higher" addresses, it will be appreciated that "adjacent" words could be those of "next lower" addresses or determined by some other relationship without departing from the scope and teaching of the present invention.

Each word select line such as WS1 (FIG. 6) and its respective adjacent word select line such as WS1-A are coupled to inputs of respective AND gates such as 71 and 72. Row boundary select lines such as 65-1 and adjacent row select lines such as 67-1 form second inputs to AND gates such as 71, 72. If a row boundary line such as 65-1 is at logical "1," a cell (e.g., 51-1) in the row defined by the decoded address (WS1) is accessed via AND gate 71 and OR gate 73. If an adjacent row boundary line such as 67-1 is at logical "1", a cell (e.g., 51-1) in the row (WS1-A) adjacent that defined by the decoded address (WSn) is accessed via AND gate 72 and OR gate 73.

Figure 7:
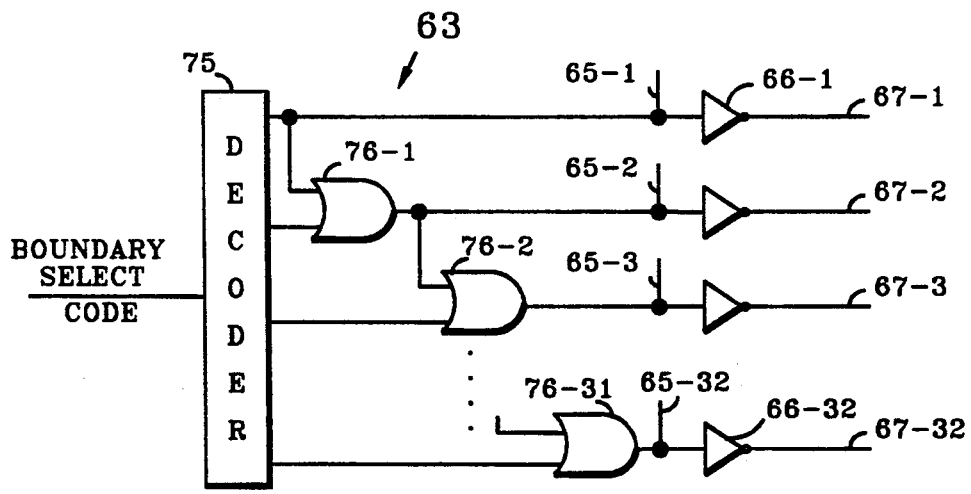
FIG. 7 is a schematic diagram of one form of the bit boundary decode logic for the embodiment of FIG. 5.

FIG. 7 illustrates one form of the bit boundary select circuit 63. A decoder circuit 75 responds to the input bit boundary select code to energize one of its 32 output lines to a logical 1 state. OR gates 76-1 to 76-31 cause an energized line 65i and all succeeding lines 65i+1 to 65-32 to be raised to their logical "1" states. For example if line 65-1 is energized, all succeeding lines 65-2 to 65-32 are energized; if the line below 65-1 is energized, lines 65-2 to 65-32 are energized, etc.

Note that the boundary select circuit 63 of FIG. 5 is not required to produce a different set of signals for odd and even addresses as was the case for boundary select circuit 33 of FIG. 3. This is due to the lines B1 to Bn being applied only to the even array 30 and their inverted lines being applied only to the odd array 31 in the example of FIG. 3 If all lines 65-1 to 65-32 are at the logical "1" states, all corresponding lines 67-1 to 67-32 are forced to the logical "0" state by inverters 66-1 to 66-32. If the line below 65-1 is raised to the logical "1" state by decoder 75, lines 65-2 to 65-32 are raised to the logical "1" state while line 65-1 is at a logical "0" state; and lines 67-2 to 67-32 are at logical "0" and line 67-1 at logical "1". Thus it is seen that decoding of the bit boundary select code will cause accessing of those cells in an addressed row (such as WS 1) which are at and follow the decoded bit boundary (e.g., cell 51-i to 51-32) and accessing of those cells (52-1 to 52i-1) of the next adjacent row which precede the decoded bit boundary.

If the decoded bit boundary is a word boundary, then all cells in the addressed word (e.g., 51-1 to 51-32 in the above example) are accessed and no cells in the adjacent word are accessed.

It will be apparent then that the results illustrated in FIGS. 4A, 4B with respect to the embodiment of FIG. 3 are also achieved with embodiment of FIGS. 5–7. In each embodiment two "adjacent" words (normally accessed by consecutive addresses) are concurrently selected for access by one address and bit boundary select logic determines which bit cells of each of the two adjacent words is in fact "accessed" for a read or write operation.

This operation occurs in one normal memory cycle. In the embodiment of FIG. 3, the "boundary select logic" and the "adjacent word" select logic are in the data input circuitry whereby the memory cell need not be modified from FIG. 2. Obviously all or part of the select logic means could be incorporated on a specially designed array chip.

In the embodiment of FIGS. 5–7 a part of the boundary select logic and all of the adjacent word select logic are internal to the memory cells whereby a uniquely designed memory cell is required which is different from that of FIG. 2.

It will be appreciated that the embodiments of FIG. 3 and FIGS. 5–7 are shown merely as illustrations of the manner in which the invention may be implemented. It will be appreciated by those skilled in the art that it can be used in a wide variety of memory arrangements including that illustrated in U.S. Pat. No. 4,099,253 issued Jul. 4, 1978 to P. G. Dooley, Jr., in which a memory is comprised of a plurality of chips, each chip containing a memory cell for a predetermined bit position of a "word" of storage.

It will also be appreciated that the invention may comprise merely a part of an otherwise conventional memory system.

Various other changes in and modifications to the preferred embodiments will be apparent to those skilled in the art without departing from the spirit and scope of the invention: and it is intended to cover all changes and all modifications in the appended claims.

What is claimed is:

1. A random access memory system which receives an address signal and a bit boundary signal representing a boundary for data which is provided to the memory system, the system comprising
   (a) a plurality of memory cells arranged in memory cell arrays, each memory cell array corresponding to a respective sequential address,
   (b) first logic means responsive to said address signal, said first logic means being configured to for concurrently selecting a first memory cell array corresponding to an address represented by said address signal and a second memory cell array corresponding to an address adjacent that of said address represented by said address signal,
   (c) second logic means responsive to said bit boundary signal for selectively accessing memory cells in said first an second memory cell arrays based upon said bit boundary signal for reading data from and writing data into the memory system on any bit boundary,
   (d) means for writing data into and retrieving data from said memory cells of said first and second memory cell arrays in one memory cycle, and
   (e) multiplexer means responsive to said bit boundary signal for orienting said data in said memory cell arrays.

2. A random access memory system addressable on bit boundaries comprising
   (a) a plurality of memory cells arranged in memory cell arrays, each memory cell array corresponding to a respective sequential address,
   (b) a source of an address signal,
   (c) first logic means responsive to said address signal for concurrently selecting a first memory cell array corresponding to said address signal and a second memory cell array corresponding to an address adjacent that of said address signal,
   (d) a source of a bit boundary signal,
   (e) second logic means responsive to said bit boundary signal for selectively accessing a group of said memory cells of said first and second memory cell arrays for reading data from and writing data into said group of memory cells on any bit boundary,
   (f) means for writing data into and retrieving data from said memory cells of said first and second memory cell arrays in one memory cycle, and
   (g) multiplexer means responsive to said bit boundary signal for orienting said data in said memory cell arrays.

3. A random access memory system which receives an address signal and a bit boundary select signal, the address signal representing an address which is chosen from a group of addresses consisting of even addresses and odd addresses, the system comprising
   (a) first and second memory arrays, each of said first and second memory arrays having a plurality of memory cells arranged in rows and columns and an address decode circuit, each row of memory cells corresponding to a storage word addressable by an associated address decode circuit;
   (b) logic means responsive to an address signal of a first type, selected from even and odd address types for concurrently applying the same address signal to the address decode circuit of said first and second memory arrays to select a corresponding row of cells from each array,
   said logic means responsive to an address signal a second type for concurrently applying an address signal of the second type to the address decode circuit of one of the first and second memory arrays and applying an address of the first type to the address decode circuit of another of the first and second memory arrays, said address of a first type corresponding to a next adjacent row to select adjacent rows of cells from said first and second arrays;
   (c) bit boundary logic responsive to the bit boundary select signal for selecting memory cells alternatively from a concurrently selected pair of rows of said first and second memory arrays for the access of a word in the memory system on any bit boundary,
   (d) means for writing data into and retrieving data from said memory cells of said first and second memory cell arrays in one memory cycle, and
   (e) multiplexer means responsive to said bit boundary signal for orienting said data in said memory cell arrays.

4. A random access memory system which receives an address signal and a bit boundary select signal comprising
   (a) first and second memory arrays, each of said first and second memory arrays having a plurality of memory cells arranged in rows and columns and an address decode circuit, each row of memory cells corresponding to a storage word addressable by an associated address decode circuit via a respective row address decode line;
   (b) logic means responsive to an even address signal for concurrently applying the same address signal to the address decode circuit of each of said first and second memory arrays to select a corresponding row of cells from each array;
   said logic means responsive to an odd address signal for concurrently applying different address signals to the address decode circuit of each of said first and second memory arrays to select adjacent rows of cells from said first and second memory arrays;
   (c) bit boundary logic responsive to the bit boundary select signal for selecting memory cells alternatively from a concurrently selected pair of rows of said first and second memory cell arrays for the access of a word in the memory system on any bit boundary,
   (d) means for writing data into and retrieving data from said memory cells of said first and second memory cell arrays in one memory cycle, and
   (e) multiplexer means responsive to said bit boundary signal for orienting said data in said memory cell arrays.

* * * * *